(12) United States Patent
Ikeda

(10) Patent No.: US 6,501,662 B2
(45) Date of Patent: Dec. 31, 2002

(54) MOTOR DRIVING INVERTER

(75) Inventor: Hideo Ikeda, Isesaki (JP)

(73) Assignee: Sanden Corporation, Gunma (JP)

( * ) Notice: Subject to any disclaimer, the term of this patent is extended or adjusted under 35 U.S.C. 154(b) by 0 days.

(21) Appl. No.: 09/769,345

(22) Filed: Jan. 26, 2001

(65) Prior Publication Data
US 2001/0012212 A1 Aug. 9, 2001

(30) Foreign Application Priority Data
Jan. 28, 2000 (JP) ......................................... 2000-019594

(51) Int. Cl.⁷ .............................. H05K 1/03; H05K 7/02; H05K 7/04
(52) U.S. Cl. ...................... 361/760; 361/702; 361/707; 361/752; 174/252; 174/260; 257/712
(58) Field of Search ................................. 174/260, 252, 174/261, 262, 265, 258; 361/760, 679, 688, 687, 702, 707, 714, 717, 718, 719, 720, 721, 722, 724, 764, 704, 705, 752; 257/712, 713

(56) References Cited

U.S. PATENT DOCUMENTS

| | | | | |
|---|---|---|---|---|
| 4,849,858 A | * | 7/1989 | Grapes et al. ............... | 361/708 |
| 5,243,218 A | * | 9/1993 | Zenitani et al. ............. | 257/712 |
| 5,367,434 A | * | 11/1994 | Griffin et al. ................ | 361/719 |
| 5,699,235 A | * | 12/1997 | Tsurumiya et al. .......... | 361/803 |
| 5,777,844 A | * | 7/1998 | Kiefer ......................... | 361/704 |
| 5,946,192 A | * | 8/1999 | Ishigami et al. ............. | 361/704 |
| 6,072,697 A | * | 6/2000 | Garcia-Ortiz ................ | 361/704 |
| 6,081,425 A | * | 6/2000 | Cheng .......................... | 361/704 |
| 6,097,600 A | * | 8/2000 | Saito et al. ................... | 361/704 |
| 6,185,101 B1 | * | 2/2001 | Itabashi et al. .............. | 361/704 |
| 6,222,732 B1 | * | 4/2001 | Jakob et al. ................. | 361/704 |
| 6,252,775 B1 | * | 6/2001 | Kuroda ........................ | 361/707 |

* cited by examiner

Primary Examiner—Kamand Cuneo
Assistant Examiner—I B Pael
(74) Attorney, Agent, or Firm—Baker Botts L.L.P.

(57) ABSTRACT

A motor driving inverter comprises a first printed circuit board provided with electronic components, a heat conduction plate made of a metal with high heat conductivity and adhered at one surface to the printed circuit board, thereby supporting the printed circuit board, a heat conduction member made of a material with high heat conductivity and connected to the heat conduction plate, thereby supporting the heat conduction plate, and a box made of a metal with high heat conductivity, accommodating the printed circuit board, the heat conduction plate and the heat conduction member, and connected to the heat conduction member, thereby supporting the heat conduction member.

11 Claims, 4 Drawing Sheets

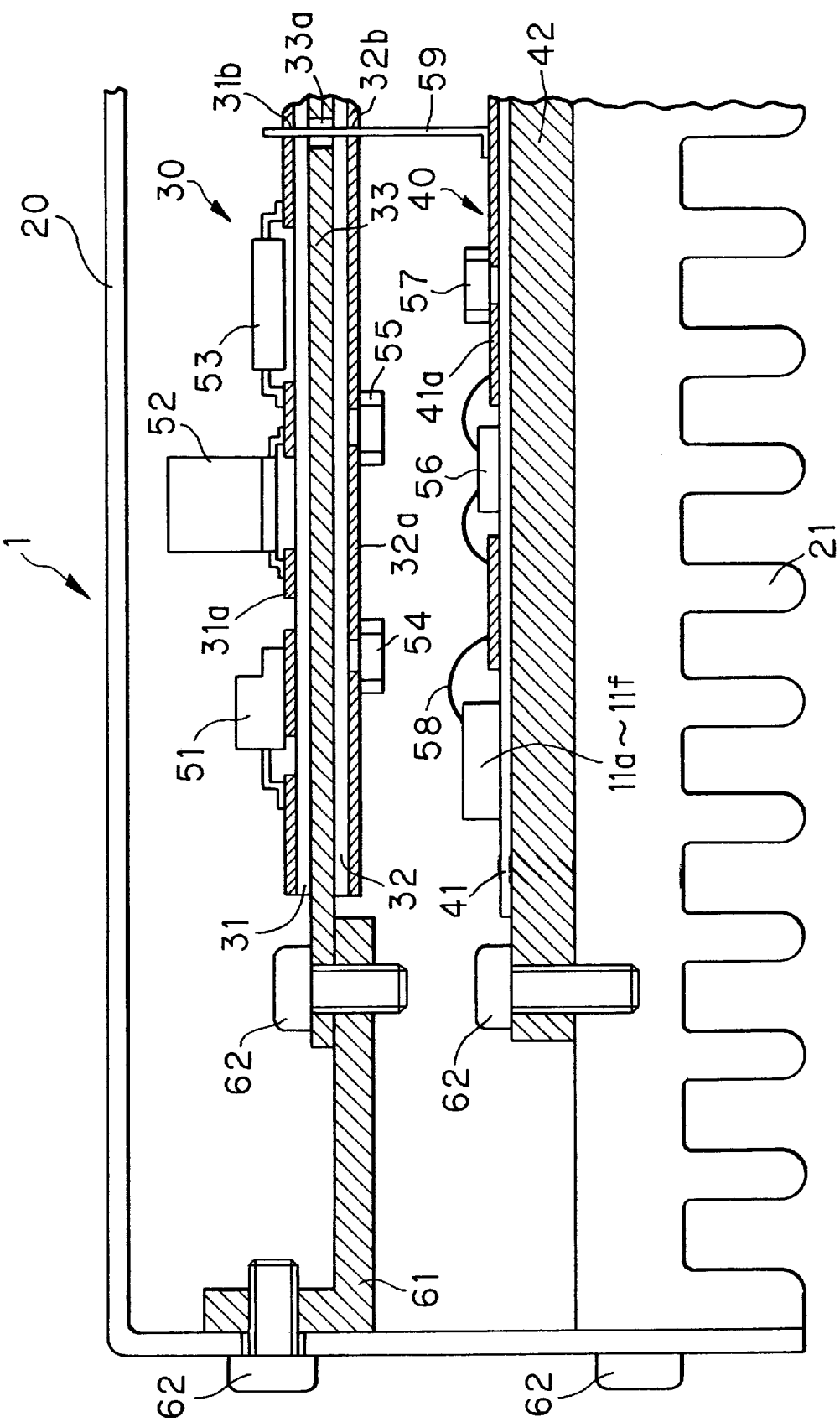

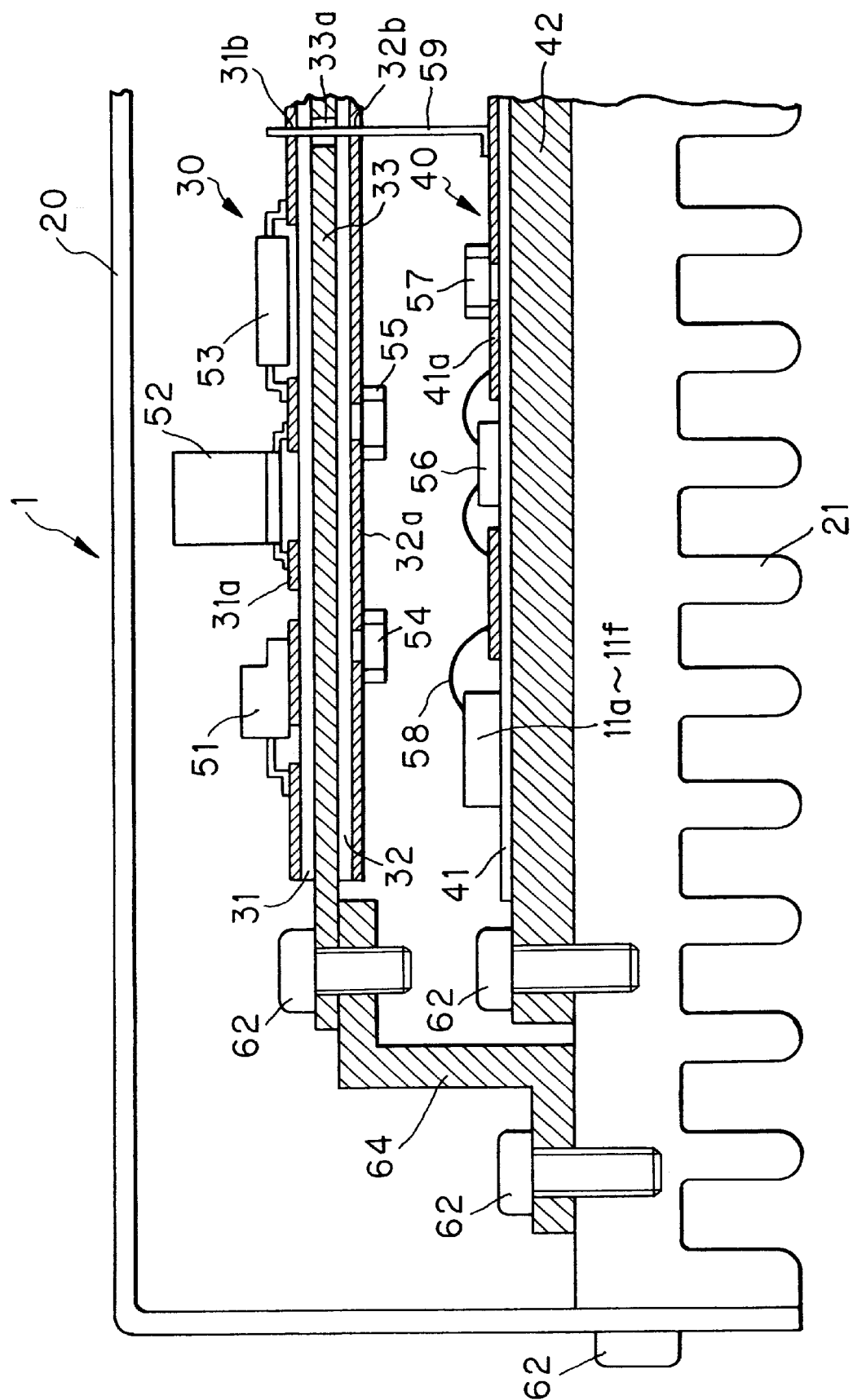

MOTOR DRIVING INVERTER

BACKGROUND OF THE INVENTION

The present invention mainly relates to a motor driving inverter for converting DC current from a DC power supply to AC current and supplying a motor-driven compressor of an air conditioner mounted on a motorcar with ac power.

Such type of motor driving inverter has a printed circuit board provided with a plurality of electronic components such as semiconductor switching devices with high current capacity, a microcontroller including an integrated circuit that is equipped with a central processing unit and on-off controls the semiconductor switching devices to produce three phase current, etc. The semiconductor switching devices generate a large quantity of heat because the motor driving inverter supplies a motor-driven compressor with heavy current. Therefore, each semiconductor switching device and each of the other electronic components such as integrated circuit devices that generate heat are provided with a radiator independently or, otherwise, the semiconductor switching devices and other electronic components such as integrated circuit devices that generate heat are cooled by a fan.

The motor driving inverter is provided with a metal box for accommodating the printed circuit board to shield the electronic components from electromagnetic noise from a number of noise sources in the motorcar and to shield electronic components in the motorcar from electromagnetic noise generated by the electronic components of the motor driving inverter.

In addition to the radiators or the fan, the motor driving inverter is provided with electromagnetic shields for shielding the microcontroller from electromagnetic noise generated by the semiconductor switching devices through which heavy currents are passed. Such shielding is required to prevent operation errors in the microcontroller.

SUMMARY OF THE INVENTION

The radiators or the fan, and the electromagnetic shields increase the size and the manufacturing cost of the motor driving inverter.

Therefore an object of the present invention is to provide a motor driving inverter for converting DC current from a DC power supply to AC current and supplying a motor-driven compressor of an air conditioner mounted on a motorcar with ac power which is compact and has high heat radiating capability.

Another object of the present invention is to provide a motor driving inverter for converting DC current from a DC power supply to AC current and supplying a motor-driven compressor of an air conditioner mounted on a motorcar with ac power which is compact and has high heat radiating capability, and whose microcontroller is shielded from electromagnetic noise from semiconductor switching devices thereof.

In accordance with the present invention, there is provided a motor driving inverter comprising a first printed circuit board provided with electronic components, a heat conduction plate made of a metal with high heat conductivity and adhered at one surface to the printed circuit board, thereby supporting the printed circuit board, a heat conduction member made of a material with high heat conductivity and connected to the heat conduction plate, thereby supporting the heat conduction plate, and a box made of a metal with high heat conductivity, accommodating the printed circuit board, the heat conduction plate and the heat conduction member, and connected to the heat conduction member, thereby supporting the heat conduction member.

In accordance with a preferred embodiment of the present invention, the heat conduction plate is adhered at the other surface to a second printed circuit board provided with an electronic component liable to be affected by electromagnetic noise, and the electronic components on the first printed circuit board are little affected by electromagnetic noise.

In accordance with another preferred embodiment of the present invention, the heat conduction plate is adhered at the other surface to a second printed circuit board provided with an electronic component liable to be affected by electromagnetic noise, and at least one of the electronic components on the first printed circuit board is liable to generate electromagnetic noise.

In accordance with another aspect of the present invention, there is provided a motor driving inverter comprising a printed circuit board provided with electronic components, a heat conduction plate made of a metal with high heat conductivity and adhered at one surface to the printed circuit board, and a box made of a metal with high heat conductivity and accommodating the printed circuit board and the heat conduction plate, wherein the heat conduction plate is fixed to the box with its the other surface abutting against the box.

BRIEF DESCRIPTION OF THE DRAWINGS

In the drawings:

FIG. 3 is a fragmentary sectional view of the motor driving inverter in accordance with the first preferred embodiment of the present invention.

FIG. 4 is a fragmentary sectional view of a motor driving inverter in accordance with a second preferred embodiment of the present invention.

DETAILED DESCRIPTION OF THE PREFERRED EMBODIMENTS

A first preferred embodiment of the present invention will be described.

Figure 1:
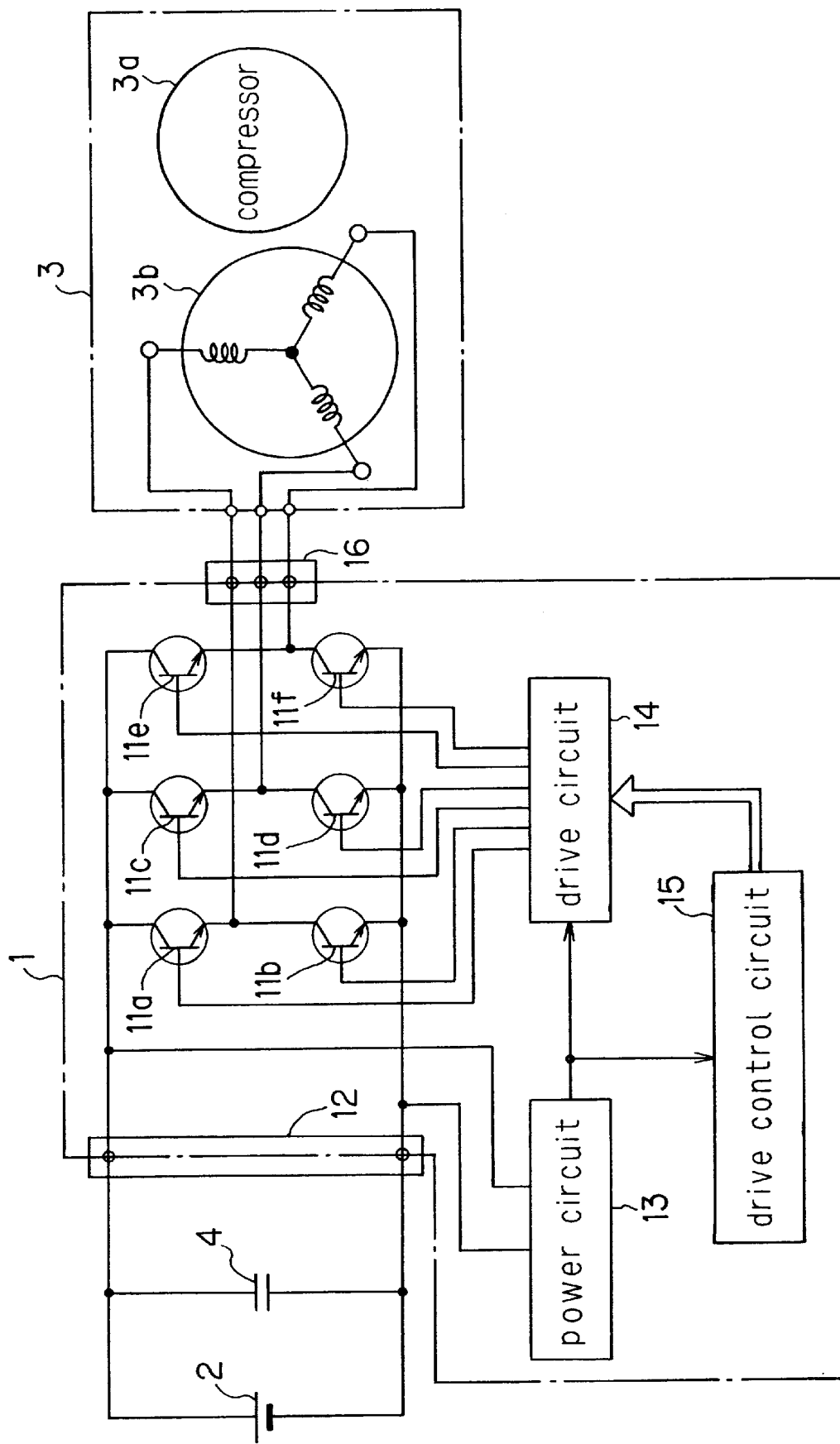
FIG. 1 is a block diagram of electronic circuits of a motor driving inverter in accordance with a first preferred embodiment of the present invention.

As shown in FIG. 1, a motor driving inverter 1 converts DC current input from a DC power supply 2 such as a battery connected in parallel with a capacitor 4 into three-phase alternating current for supply to the motor 3b of an electric motor-driven compressor 3 of an air conditioner mounted on a motorcar, thereby driving the compressor 3a of the electric motor-driven compressor 3.

The motor driving inverter 1 is provided with a plurality of semiconductor switching devices such as switching power transistors 11a, 11b, 11c, 11d, 11e and 11f, a power connector 12, a power circuit 13, a drive circuit 14, a drive control circuit 15 and an output connector 16.

The collector of the power transistor 11a is connected to the positive pole of the power connector 12, the emitter of the switching power transistor 11a is connected to the collector of the power transistor 11b, the emitter of the power transistor 11b is connected to the negative pole of the power connector 12. The power transistors 11c and 11d are connected to each other and connected to the power connector 12 in the same way as the power transistors 11a and 11b. The power transistors 11e and 11f are connected to each other and connected to the power connector 12 in the same way as the power transistors 11a and 11b.

The connecting point between the power transistors 11a and 11b, i.e. the connecting point between the emitter of the power transistor 11a and the collector of the power transistor 11b is connected through the output connector 16 to the first terminal of the motor 3b. The connecting point between the power transistors 11c and 11d is connected through the output connector 16 to the second terminal of the motor 3b. The connecting point between the power transistors 11e and 11f is connected through the output connector 16 to the third terminal of the motor 3b. Control signals are input independently from the drive circuit 14 to the bases of the power transistors 11a to 11f.

The power circuit 13 is supplied with DC power from the DC power supply 2 through the power connector 12. It adjusts the voltage of the DC power and thereafter supplies it to the drive circuit 14 and the drive control circuit 15.

The drive circuit 14 generates control signals for independently on-off switching the power transistors 11a to 11f based on a timing control signal input from the drive control circuit 15 and outputs them to the bases of the power transistors 11a to 11f.

The drive control circuit 15 is provided with a microcontroller including a CPU, a memory, etc. which are integrated with each other. The drive control circuit 15 is operated by a control program stored in the memory to output the timing control signal for controlling the rotation speed of the motor 3b to the drive circuit 14.

Figure 2:
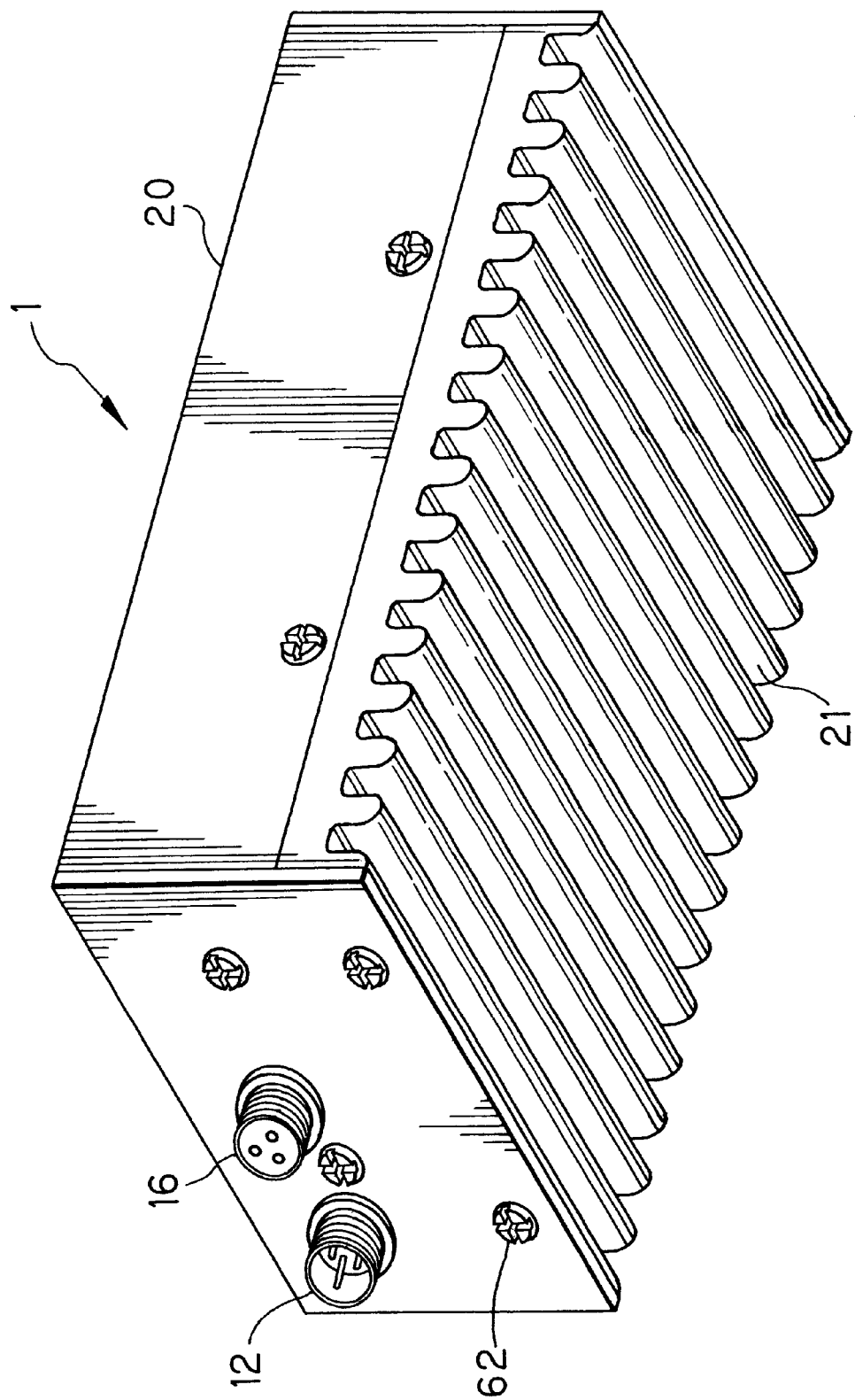
FIG. 2 is a perspective view of a motor driving inverter in accordance with a first preferred embodiment of the present invention.

As shown in FIGS. 2 and 3, the motor driving inverter 1 is provided with a rectangular-parallelepiped-shaped box 20 made of a metal with high heat conductivity such as aluminium. The box 20 is provided with a radiator 21 including radiating fins protruding outward. The radiator 21 is made of a metal with high heat conductivity such as aluminium. The radiator 21 forms the bottom wall of the box 20. Printed circuit board assemblies 30 and 40 provided with the aforementioned electronic circuits are mounted in the box 20. The power connector 12 and the output connector 16 are disposed on a side wall of the box 20.

The printed circuit board assembly 30 comprises a printed circuit board 31 and a printed circuit board 32 made of an insulating material such as fiber-glass reinforced epoxy resin, a heat conduction plate 33 made of a metal with high heat conductivity such as aluminium. The heat conduction plate 33 is adhered at one surface to the printed circuit board 31 and at the other surface to the printed circuit board 32 by an adhesive agent with high heat conductivity such as a silicon adhesive agent. The heat conduction plate 33 supports the printed circuit board 31 and the printed circuit board 32.

The printed circuit board 31 is provided with conductive paths 31a and electronic components such as a transistor 51, an electronic component 52 and a microcontroller 53 including an integrated circuit equipped with a central processing unit, which are mounted on the conductive paths 31a to form the drive control circuit 15.

The printed circuit board 32 is provided with conductive paths 32a and electronic components 54, 55 mounted on the conductive paths 32a to form the power circuit 13.

The heat conduction plate 33 is fixed to and supported by an L-shaped heat conduction member 61 at its one end protruding from the printed circuit boards 31 and 32 by a screw 62. The heat conduction member 61 is made of a material with high heat conductivity such as aluminium. The heat conduction member 61 is fixed to the box 20 by a screw 62.

The printed circuit board assembly 40 comprises a printed circuit board 41 made of an insulating material such as fiber-glass reinforced epoxy resin and a heat conduction plate 42 made of a metal with high heat conductivity such as aluminium. The heat conduction plate 42 is adhered at one surface to the printed circuit board 41 by an adhesive agent with high heat conductivity such as a silicon adhesive agent. The heat conduction plate 42 supports the printed circuit board 41.

The printed circuit board 41 is provided with conductive paths 41a and electronic components such as the power transistors 11a to 11f, an electronic device 56 forming the drive circuit 14 and an electronic component 57. Face bonding type devices are adhered to the printed circuit board 41 and connected to the conductive paths 41a by lead wires 58. Other devices are mounted on the conductive paths 41a.

The power transistors 11a to 11f, the electronic device 56 and the electronic component 57 oppose the electronic components 54 and 55.

The heat conduction plate 42 is fixed to the radiator 21 by a screw 62. The other surface of the heat conduction plate 42 abuts against the radiator 21.

The printed circuit boards 31 and 32 are provided with through holes 31b and 32b. The heat conduction plate 33 is provided with a penetrating hole 33a. A lead wire 59 is passed through the through holes 31b and 32b and the penetrating hole 33a and soldered to the conductive paths 31a, 32a and 41a. The lead wire 59 is insulated from the heat conduction plate 33. Thus the electronic circuits mounted on the printed circuit board assembly 30 are connected to the electronic circuits mounted on the printed circuit board assembly 40.

In the motor driving inverter 1, heat generated by the electronic components mounted on the printed circuit boards 31 and 32 is transferred to the heat conduction plate 33 made of a metal with high heat conductivity, further to the heat conduction member 61 made of a material with high heat conductivity, and finally to the box 20 made of a metal with high heat conductivity to be radiated into the atmosphere. Thus, the heat generated by the electronic components is efficiently radiated into the atmosphere.

The heat generated by the electronic components mounted on the printed circuit board 41 is transferred to the heat conduction plate 42 made of a metal with high heat conductivity and further to the radiator 21 made of a metal with high heat conductivity to be radiated into the atmosphere. Thus, the heat generated by the electronic components is efficiently radiated into the atmosphere.

The motor driving inverter 1 does not need a cooling fan or an independent radiator connected to each electronic component generating heat.

Therefore, the motor driving inverter 1 has high heat radiating capability, is compact, and can be manufactured at low cost.

The motor driving inverter 1 has the box 20 provided with the radiator 21 to which the heat conduction plate 42 is connected. Therefore, the efficiency of heat radiation from the printed circuit board 41 provided with the power transistors 11a to 11f, which generate a large quantity of heat, to the atmosphere is high.

The electromagnetic noise from a number of noise sources in the motorcar is blocked by the box 20 made of a metal. Therefore, the drive control circuit 15 including the microcontroller 53 liable to be affected by electromagnetic noise is shielded from electromagnetic noise and protected against operation error.

The electromagnetic noise generated by the switching power transistors 11a to 11f mounted on the printed circuit board 41 is blocked by the heat conduction plate 33 made of a metal. Therefore, the drive control circuit 15 including the microcontroller 53 liable to be affected by electromagnetic noise is shielded from electromagnetic noise and protected against operation error. The power circuit 13, the drive circuit 14 and the electronic component 57 are not susceptible to operation errors because they are little affected by electromagnetic noise.

The heat generated by the integrated circuit devices such as the microcontroller 53 is efficiently radiated into the atmosphere through the heat conduction plate 33 and the heat conduction member 61. Therefore, the integrated circuit devices are protected against temperature rise and operation error caused by temperature rise.

The heat conduction plate 33 made of a metal with high heat conductivity operates as a heat conduction member and an electromagnetic noise shield member. Therefore, the motor driving inverter 1 does not need to have an electromagnetic noise shield member independent of a heat conduction member. This enables downsizing of the motor driving inverter 1 and reduction of the manufacturing cost of the motor driving inverter 1.

As shown in FIG. 4, the heat conduction plate 33 can be connected to the radiator 21 through a reverse Z-shaped heat conduction member 64 made of a material with high heat conductivity such as aluminium. Thus the efficiency of heat radiation of the heat conduction plate 33 is enhanced.

The radiator 21 of the box 20 may be replaced with an ordinary wall.

The heat conduction plate 42 may be connected to the box 20 through a heat conduction member like the heat conduction member 61.

The printed circuit board 31 may be provided with the drive control circuit 15, which is liable to be affected by electromagnetic noise, and the power circuit 13, while the printed circuit board 32 may be provided with the power transistors 11a to 11f, which are liable to generate electromagnetic noise, the drive circuit 14 and the electronic component 57. In this case, the printed circuit board assembly 40 can be eliminated to reduce the manufacturing cost of the motor driving inverter 1.

The heat conduction plate 33 and the heat conduction member 61 may be made integral as a unitary member. The heat conduction plate 33 and the heat conduction member 64 may be made integral as a unitary member. Use of unitary members reduces the number of elements and lowers the manufacturing cost of the motor driving inverter 1.

The motor driving inverter 1 can be used not only for motor-driven compressors of air conditioners mounted on motorcars but also motor-driven compressors of duty controlled air conditioners, motor-driven compressors of duty controlled refrigerators mounted on dispensers, etc.

While the present invention has been described with reference to preferred embodiments, one of ordinary skill in the art will recognize that modifications and improvements may be made while remaining within the spirit and scope of the present invention. The scope of the invention is determined solely by the appended claims.

What is claimed is:

1. A motor driving inverter comprising a first printed circuit board provided with electronic components, a heat conduction plate made of a metal with high heat conductivity and adhered at one surface to the printed circuit board, thereby supporting the printed circuit board, a heat conduction member made of a material with high heat conductivity and connected to the heat conduction plate, thereby supporting the heat conduction plate, and a box made of a metal with high heat conductivity, accommodating the printed circuit board, the heat conduction plate and the heat conduction member, and connected to the heat conduction member, thereby supporting the heat conduction member.

2. A motor driving inverter of claim 1, wherein a part of the box forms a radiator connected to the heat conduction member to support it.

3. A motor driving inverter of claim 1, wherein the electronic components include a semiconductor switching device.

4. A motor driving inverter of claim 1, wherein the electronic components include an integrated circuit device.

5. A motor driving inverter of claim 1, further comprising a second printed circuit board provided with an electronic component and adhered to the other surface of the heat conduction plate.

6. A motor driving inverter of claim 1, further comprising a second printed circuit board provided with an electronic component and adhered to the other surface of the heat conduction plate, wherein at least one of the electronic components on the first printed circuit board is adapted to generate electromagnetic noise.

7. A motor driving inverter comprising a printed circuit board provided with electronic components, a heat conduction plate made of metal with high heat conductivity, wherein the heat conduction plate is adhered at one surface to the printed circuit board, and extends beyond at least one end of the circuit board and substantially the entire length of the printed circuit board, and a box made of metal with high heat conductivity and accommodating the printed circuit board and the heat conduction plate, wherein the heat conduction plate is fixed to the box.

8. A motor driving inverter of claim 7, wherein a part of the box forms a radiator to which the heat conduction plate is fixed.

9. A motor driving inverter of claim 7, wherein the electronic components include a semiconductor switching device.

10. A motor driving inverter comprising a first non-metal printed circuit board provided with electronic components, a heat conduction plate made of metal with high heat conductivity, wherein the heat conduction plate is adhered at one surface to the printed circuit board, and extends beyond at least one end of the circuit board and substantially the entire length of the printed circuit board, a heat conduction member made of a material with high heat conductivity and connected to the heat conduction plate, thereby supporting the heat conduction plate, and a box made of metal with high heat conductivity and accommodating the printed circuit board, the heat conduction plate, and the heat conduction member, wherein the heat conduction member is fixed to the box.

11. A motor driving inverter comprising a non-metal printed circuit board provided with electronic components, a heat conduction plate made of metal with high heat conductivity, wherein the heat conduction plate is adhered at one surface to the printed circuit board, and extends beyond at least one end of the circuit board and substantially the entire length of the printed circuit board, and a box made of metal with high heat conductivity and accommodating the printed circuit board and the heat conduction plate, wherein the heat conduction plate is fixed to the box.

* * * * *